United States Patent [19]
Geiss et al.

[11] Patent Number: 5,356,837
[45] Date of Patent: Oct. 18, 1994

[54] METHOD OF MAKING EPITAXIAL COBALT SILICIDE USING A THIN METAL UNDERLAYER

[75] Inventors: Peter J. Geiss, Underhill, Vt.; Thomas J. Licata, Lagrangeville; Herbert L. Ho, Washingtonville, both of N.Y.; James G. Ryan, Newtown, Conn.

[73] Assignee: International Business Machines Corporation, Armonk, N.Y.

[21] Appl. No.: 145,429

[22] Filed: Oct. 29, 1993

[51] Int. Cl.$^5$ .................................. H01L 21/44
[52] U.S. Cl. .................................. 437/200; 437/247; 437/31; 437/950
[58] Field of Search ............... 437/200, 247, 31, 950

[56] References Cited

U.S. PATENT DOCUMENTS

| | | | |
|---|---|---|---|
| 4,492,971 | 1/1985 | Bean et al. | 357/15 |
| 4,554,045 | 11/1985 | Bean et al. | 156/613 |
| 4,640,004 | 2/1987 | Thomas et al. | 29/590 |
| 4,814,294 | 3/1989 | West et al. | 437/200 |
| 5,010,037 | 4/1991 | Lin et al. | 437/200 |
| 5,047,367 | 9/1991 | Wei et al. | 437/200 |
| 5,063,422 | 11/1991 | Hillenius et al. | 357/23.3 |
| 5,094,981 | 3/1992 | Chung et al. | 437/190 |
| 5,170,242 | 12/1992 | Stevens et al. | 257/751 |

FOREIGN PATENT DOCUMENTS

| | | | |
|---|---|---|---|
| 0128659 | 7/1985 | Japan | 437/200 |
| 0150943 | 6/1988 | Japan | 437/200 |

OTHER PUBLICATIONS

Reader, A. H., et al, "The Formation of Epitaxial CoSi$_2$ Thin Films on (001) Si From Amorphous Co-W Alloys", Applied Surface Science 53 (1991) pp. 92-102.

*Primary Examiner*—R. Bruce Breneman
*Assistant Examiner*—Ramamohan Rao Paladugu
*Attorney, Agent, or Firm*—Heslin & Rothenberg

[57] ABSTRACT

An epitaxial cobalt silicide film is formed using a thin metal underlayer, which is placed underneath a cobalt layer prior to a heating step which forms the silicide film. More specifically, a refractory metal layer comprising tungsten, chromium, molybdenum, or a silicide thereof, is formed overlying a silicon substrate on a semiconductor wafer. A cobalt layer is formed overlying the refractory metal layer. Next, the wafer is annealed at a temperature sufficiently high to form an epitaxial cobalt silicide film overlying the silicon substrate. Following this annealing step, a cobalt-silicon-refractory metal alloy remains overlying the epitaxial cobalt silicide film. This silicide is then used to form a shallow P-N junction by dopant out-diffusion. First, either a P or N-type dopant is implanted into the silicide film so that substantially none of the dopant is implanted into the underlying silicon substrate. After implanting, the dopant is out-diffused from the silicide film into the underlying silicon substrate at a drive temperature sufficiently high to form the desired P-N junction.

34 Claims, 6 Drawing Sheets fig. 1 fig. 2 fig. 4 fig. 3 fig. 5 fig. 6 fig. 7 fig. 8

METHOD OF MAKING EPITAXIAL COBALT SILICIDE USING A THIN METAL UNDERLAYER

FIELD OF THE INVENTION

The present invention relates generally to the formation of cobalt silicide films for use in semiconductor devices and, in particular, to the formation of epitaxial cobalt silicide films using a thin metal underlayer.

DESCRIPTION OF THE PRIOR ART

Cobalt silicide films are often used in CMOS integrated circuits as a low resistance source for the out-diffusion of dopants used to form shallow P-N junctions in source and drain regions. Out-diffusion of these dopants typically requires that the cobalt silicide film being used as a dopant source be heated to a relatively high-temperature for an extended time period in order to achieve a sufficient drive of the dopant into an underlying silicon substrate. A significant limitation on the use of these silicide films is that this heating often causes agglomeration of the cobalt silicide film. Agglomeration is disadvantageous because it produces very thin points or opens at pre-existing grain boundaries in the polycrystalline silicide and also results in a large variation in the grain size and depth of the cobalt silicide film. As a result, an agglomerated film exhibits large variations in contact resistance, poor contact etch stopping, and increased shallow junction leakage. Further, because agglomeration is strongly correlated to decreasing silicide thickness, prior cobalt silicide films have a practical lower limit on their thickness when used as out-diffusion sources. As the silicide film becomes thinner, agglomeration becomes more pronounced for a given out-diffusion cycle. A method for forming a silicide more resistant to agglomeration would permit a thinner silicide to be used and a shallower junction to be obtained (for a given out-diffusion drive cycle).

Previous attempts have been made to reduce agglomeration and thus improve the thermal stability of cobalt silicide films. For example, it has been found that the formation of an epitaxial cobalt silicide film exhibits improved thermal stability relative to prior polycrystalline films. One prior approach has formed an epitaxial cobalt silicide film by first sputtering a 10–30 nm Ti layer and then sputtering a Co layer over the Ti layer prior to the annealing step that forms the epitaxial cobalt silicide film. However, this approach does not provide a useful out-diffusion source because residual Ti in the cobalt silicide and at the silicide surface forms stable compounds with certain dopant atoms such as B, which is used as a dopant in PMOS devices. The formation of these compounds can significantly retard out-diffusion and limit the junction concentration of the dopant at the silicon-silicide interface. Therefore, the use of a Ti layer is not practical for forming P-type source/drain regions.

Thus, there is a need for a method of forming an epitaxial cobalt silicide film which has improved thermal stability. Also, there is a need for a method of forming an out-diffusion source for forming shallow junctions that can be used in CMOS circuits, which require both N and P-type source/drain regions.

SUMMARY OF THE INVENTION

This need is satisfied, the limitations of the prior art overcome, and other benefits realized in accordance with the principles of the present invention by a process for forming an epitaxial cobalt silicide film in which a metal underlayer is formed underneath a cobalt layer prior to a heating step which forms the silicide film. More specifically, a refractory metal layer comprising tungsten, chromium, molybdenum, or a silicide thereof, is formed overlying a silicon substrate on a semiconductor wafer. Also, the refractory metal layer may comprise a mixture of tungsten, chromium, or molybdenum, with a chromium-molybdenum mixture being preferred. A cobalt layer is formed overlying the refractory metal layer. Next, the wafer is annealed at a temperature sufficiently high to form an epitaxial cobalt silicide film overlying the silicon substrate. Following this annealing step, a cobalt-silicon-refractory metal alloy remains overlying the epitaxial cobalt silicide film, which is overlying the silicon substrate. After formation, the silicide film according to the present invention has, for example, an average resistivity of about 15 micro-ohm-cm.

In one approach, a tungsten metal layer having a thickness of about 0.5 to 2.5 nm is sputtered or evaporated onto a silicon substrate, a cobalt layer having a thickness of about 5 to 20 nm is sputtered or evaporated onto the tungsten metal layer, and then both layers are annealed at a temperature greater than about 550° C. for a time period greater than about 20 seconds. After annealing, an epitaxial cobalt silicide film is disposed on the surface of the silicon substrate, and a cobalt-silicon-tungsten alloy is disposed on the surface of the silicide film. Preferably, the tungsten metal layer and the cobalt layer are formed consecutively in situ without removal from a vacuum environment. This avoids the formation of a detrimental oxide film on the surface of the tungsten metal layer. More preferably, the annealing temperature is about 750° to 900° C. and the annealing is performed using rapid thermal annealing. The final formed epitaxial cobalt silicide film has a thickness of, for example, about 40 nm.

The present invention also provides a method for forming a shallow P-N junction by dopant out-diffusion from an epitaxial cobalt silicide film which has been previously formed on a silicon substrate, such as by the process described above. First, either a P or N-type dopant, such as B, Ga, P, Sb, or As, is implanted into the silicide film in regions where source/drain junctions are to be formed. In performing this implant, it is preferable that substantially none of the dopant is implanted into the underlying silicon substrate. After implanting, the dopant is out-diffused from the silicide film into the underlying silicon substrate at a drive temperature sufficiently high to form the desired P-N junction. In one approach, the drive temperature is at least about 800° C., and the out-diffusion is performed for at least about 15 seconds. These conditions may vary for different combinations of dopants (e.g. B and P), as one skilled in the art will recognize. However, it is desirable to use a single drive for both the N and P dopants.

In one approach, a shallow P-N junction is formed by dopant out-diffusion from an epitaxial cobalt silicide film by first forming a tungsten metal layer on a silicon substrate; forming a cobalt layer on the tungsten metal layer; annealing the cobalt and tungsten layers at a temperature greater than about 550° C. for a time period greater than about 20 seconds to form the epitaxial cobalt silicide film on the silicon substrate; implanting a dopant into the epitaxial cobalt silicide film; and out-diffusing the dopant from the epitaxial cobalt silicide film into the underlying silicon substrate by annealing at a drive temperature sufficiently high to form the P-N junction. As recognized by one skilled in the art, the drive temperature will vary depending upon the particular dopant and the desired junction dopant concentration.

An important advantage of the present invention is that an epitaxial cobalt silicide film is formed that both has improved thermal stability and does not form residuals which react with desired dopants. Thus, an epitaxial cobalt silicide film formed according to the present invention permits the formation of both N and P-type source/drain regions having high interface junction concentrations without the problems associated with agglomeration. Another advantage is that the cobalt silicide film formed according to the present invention has improved uniformity, which, for example, allows closer placement of the silicide-silicon interface to a metallurgical junction without inducing increased junction leakage. In addition, a non-agglomerated silicide film formed according to the present invention produces a better contact etch stop and barrier metal for contact metallurgy. In contrast, prior agglomerated silicide films tend to have gaps in the silicide which allows etching of the junction silicon during contact etch and penetration of the contact metallurgy into the junction, both of which may lead to junction leakage.

The foregoing and other objects, features, and advantages of the invention will be apparent from the following more particular description of a preferred embodiment of the invention, as illustrated in the accompanying drawings.

BEST MODE FOR CARRYING OUT THE INVENTION

The present invention provides both a method for forming an epitaxial cobalt silicide film and a method for out-diffusion from an epitaxial cobalt silicide film that are generally applicable to the formation of self-aligned shallow junctions in integrated circuits. In addition, the silicide films formed according to the present invention may be used in general for any process requiring silicidation of pre-formed shallow junctions. According to the present invention, an epitaxial cobalt silicide film is formed by a process in which a metal underlayer is first formed underneath a cobalt layer, and then the metal and cobalt layers are heated to form the silicide film.

More specifically, a refractory metal layer comprising tungsten, chromium, molybdenum, or a silicide thereof, is formed overlying a silicon substrate on a semiconductor wafer. In addition, a mixture of tungsten, chromium, or molybdenum may be used as the refractory metal layer. A preferred mixture that may be used is a chromium-molybdenum mixture, which is believed to be an alloy. A cobalt layer is formed overlying the refractory metal layer. Next, the wafer is annealed at a temperature sufficiently high to form an epitaxial cobalt silicide film overlying the silicon substrate. Following this annealing step, a cobalt-silicon-refractory metal alloy remains overlying the epitaxial cobalt silicide film, which is itself overlying the silicon substrate. The use of the silicide film as an out-diffusion source following its formation is discussed later.

Figure 1:
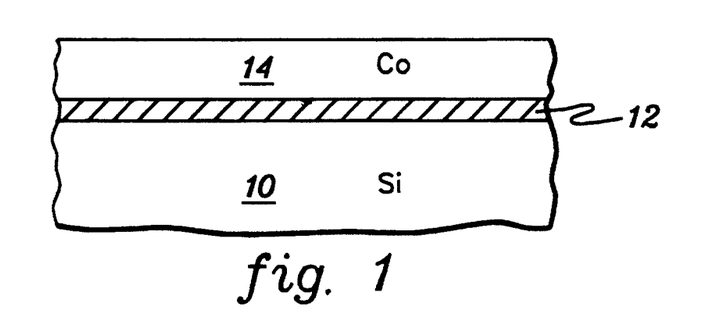
FIGS. 1 and 2 are cross-sectional views illustrating the formation of an epitaxial cobalt silicide film according to the method of the present invention.

Referring now to FIG. 1, in a preferred approach a silicon substrate 10 is provided, and a tungsten metal layer 12 having a thickness of about 0.5 to 2.5 nm is sputtered or evaporated onto silicon substrate 10. Greater thicknesses of tungsten may be used for layer 12, but as the thickness exceeds about 3 nm, the quality of the silicide film deteriorates. Also, sputtering is preferred because tungsten is a relatively heavy material, and so it sputters uniformly and slowly when using an argon atmosphere. Silicon substrate 10 may be found in those regions of a semiconductor wafer, for example, requiring source and drain diffusions in a CMOS circuit.

A cobalt layer 14 having a thickness of about 5 to 20 nm is sputtered or evaporated onto tungsten metal layer 12. Next, both tungsten and cobalt layers 12 and 14 and silicon substrate 10 are annealed at a temperature greater than about 550° C. for a time period greater than about 20 seconds to form the final silicide film. A more preferred time period is about 30 seconds. Also, more preferably the annealing temperature is between about 750° and 900° C., with an optimum annealing temperature of about 850° C. During annealing, cobalt atoms from cobalt layer 14 diffuse downwards through tungsten metal layer 12 and then react with the silicon in substrate 10 to form epitaxial $CoSi_2$.

It is preferable that the step of forming cobalt layer 14 be performed in situ in the same vacuum environment used to form tungsten metal layer 12 so that an undesired oxide layer does not form on tungsten layer 12. For example, this can be accomplished when both the tungsten and cobalt are to be sputtered by not removing the wafer from the sputterer. The annealing is preferably done by rapid thermal annealing (RTA) so that rapid heating to the reaction temperature for the formation of $CoSi_2$ is obtained. However, other apparatus such as a furnace may be used.

Figure 2:
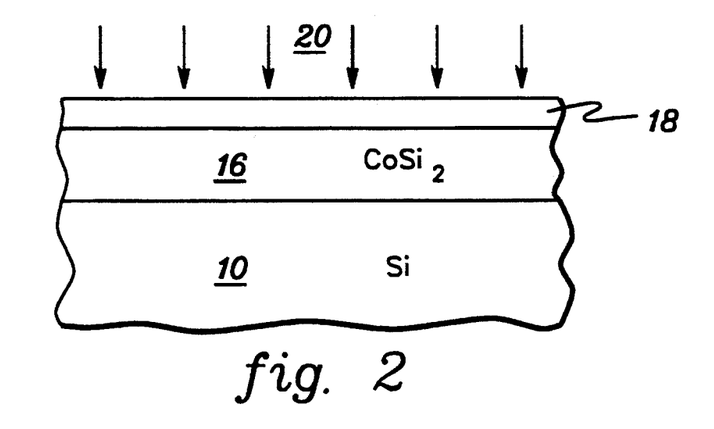

Referring now to FIG. 2, after annealing, an epitaxial cobalt silicide film 16 is disposed on the it is believed that tungsten layer 12 acts as a diffusion barrier to both Co and Si at lower temperatures. Reactions between Co and Si at lower temperatures typically form CoSi and $Co_2Si$, which are undesired forms as they do not form an epitaxial silicide and exhibit high electrical resistance. Tungsten layer 12 aids in the formation of an epitaxial $CoSi_2$ because it prevents these undesired reactions until a sufficiently high temperature is reached. At this higher temperature, Co diffuses through the tungsten layer and reacts with Si to form substantially only the desirable $CoSi_2$ form, while skipping the intermediate, lower temperature CoSi and $Co_2Si$ phases.

Although FIGS. 1 and 2 have been described with reference to a refractory metal layer of tungsten, it is believed that the other Group VIB metals of the periodic table (i.e. chromium and molybdenum) may be used as the refractory metal layer formed underneath the cobalt layer. Further, it is believed that silicides of the Group VIB metals may also be used as the refractory metal layer. All of these other materials possess the properties that allow them to function as the diffusion barrier described with reference to tungsten above. Specifically, these properties include that the Group VIB metals do not form disilicides themselves until temperatures greater than that required to form $CoSi_2$ are achieved, and the silicides of the Group VIB metals have a melting point greater than that of $CoSi_2$. Further, it is believed that none of these alternative refractory metal layer materials form stable compounds with B, Ga, P, Sb, or As and can surface of silicon substrate 10, and a cobalt-silicon-tungsten alloy layer 18 is disposed on the surface of silicide film 16. The final formed epitaxial cobalt silicide film 16 has a thickness of, for example, about 40 nm. Alloy layer 18 has a thickness that is substantially the same as the original thickness of tungsten metal layer 12, for example about 0.5 to 2.5 nm. In addition, note that epitaxial cobalt silicide film 16 is of the form $CoSi_2$. Other forms of cobalt silicide are unable to form an epitaxial layer.

Several properties of the final epitaxial cobalt silicide film compare favorably with those of conventional polycrystalline $CoSi_2$ films. For example, a conventional $CoSi_2$ film was formed on a wafer using a 18 nm sputtered layer of Co and by annealing at 750° C. for 30 seconds in a forming gas of about 5–10 percent hydrogen in nitrogen. The mean sheet resistance of the film was about 3 ohms per square. In comparison, an epitaxial $CoSi_2$ film was formed by the present invention using a 1.0 nm sputtered W layer underneath an 18 nm sputtered Co layer. Annealing was then performed at 850° C. for 30 seconds. The mean sheet resistance of this silicide film was about 2.7 ohms per square. This sheet resistance indicates that substantially all of the Co is converted to $CoSi_2$ according to the method of the present invention. Thus, the silicide film by the present invention has a sheet resistance substantially the same as that for a conventional silicide film.

With respect to the reaction mechanism involved, thus be used as effective out-diffusion sources as described below.

In addition to providing a method for forming an epitaxial cobalt silicide layer, the present invention provides a method for forming a shallow P-N junction by dopant out-diffusion from an epitaxial cobalt silicide film which has been previously formed on a silicon substrate, such as by the process described above. First, either a P or N-type dopant, such as B, P, or As, is implanted into an epitaxial cobalt silicide film in regions where source/drain junctions are to be formed. In performing this implant, it is preferable that substantially none of the dopant be implanted into the underlying silicon substrate. After implanting, the dopant is out-diffused from the silicide film into the underlying silicon substrate at a drive temperature sufficiently high to form the desired P-N junction. As recognized by one skilled in the art, the out-diffusion conditions vary depending on the dopant and the desired junction properties.

In a preferred approach according to the present invention, a shallow P-N junction is formed by dopant out-diffusion from an epitaxial cobalt silicide film by first forming a tungsten metal layer on a silicon substrate; then forming a cobalt layer on the tungsten metal layer; and annealing the cobalt and tungsten layers at a temperature greater than about 550° C. for a time period greater than about 20 seconds to form the epitaxial cobalt silicide film on the silicon substrate. Next, a dopant is implanted into the epitaxial cobalt silicide film (this implant is indicated by the arrows 20 in FIG. 2). Finally, the dopant is out-diffused from the epitaxial cobalt silicide film into the underlying silicon substrate by annealing at a drive temperature sufficiently high to form the P-N junction. The drive temperature is determined by the particular junction properties desired. As recognized by one skilled in the art, the drive temperature and/or time will vary depending upon the particular dopant and the desired junction dopant profile (e.g. dopant concentration and depth).

Figure 3:
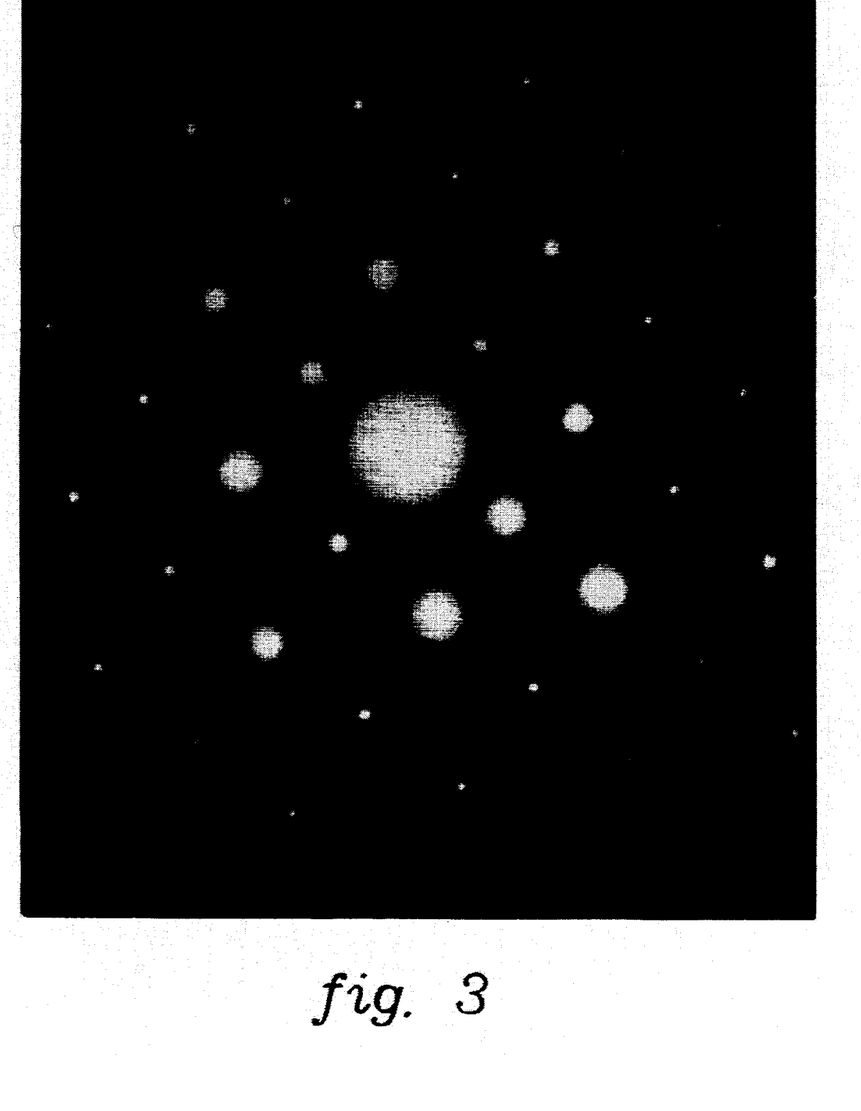
FIG. 3 is an electron diffraction pattern of an epitaxial cobalt silicide film formed by the method of the present invention.

FIG. 3 is an electron diffraction pattern of an epitaxial cobalt silicide film formed by the method of the present invention. The well-defined spots and the absence of rings in this pattern indicate that the film is indeed epitaxial. Also, other measurements have indicated that the Co atoms are the primary migratory species during silicide formation.

Figure 4:
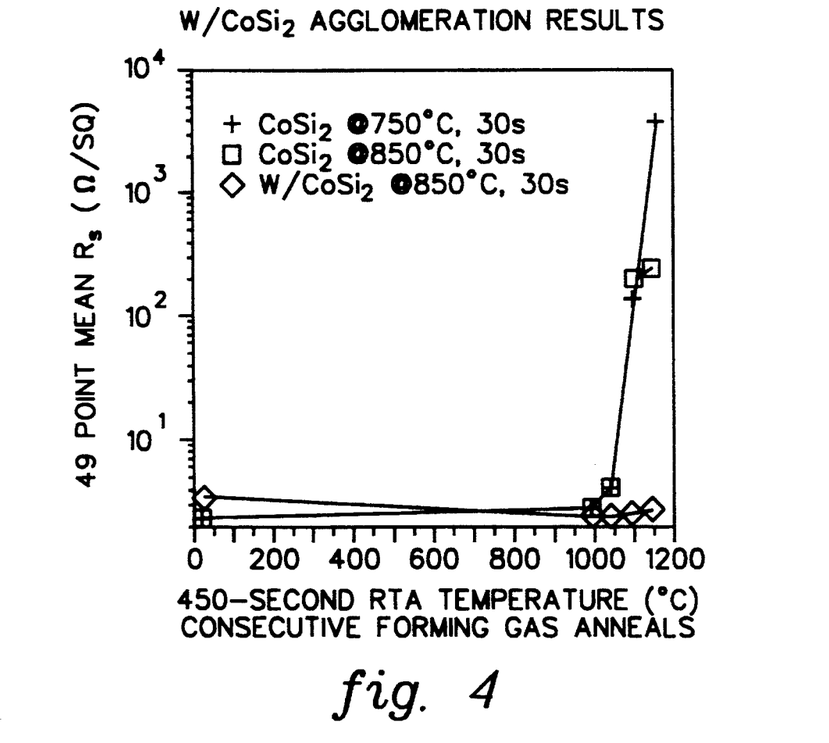
FIG. 4 is a graph of a mean sheet resistance versus annealing temperature for a cobalt silicide film formed according to the present invention contrasted with profiles for conventional cobalt silicide films.

A significant advantage of the epitaxial $CoSi_2$ films formed in accordance with the present invention is that they are very resistant to agglomeration relative to conventional polycrystalline $CoSi_2$ films. FIG. 4 is a graph of a mean sheet resistance versus annealing temperature profile for a cobalt silicide film formed according to the present invention contrasted with profiles for conventional cobalt silicide films. Two conventional $CoSi_2$ films were formed under annealing conditions of 750° C. for 30 seconds and 850° C. for 30 seconds. An epitaxial $CoSi_2$ film was formed using a W underlayer with an anneal condition of 850° C. for 30 seconds. Each film was then subjected to consecutive 450-second RTA forming gas anneals as indicated in the graph. The sheet resistance following each anneal is plotted on the vertical axis. As seen in FIG. 4, the $W/CoSi_2$ film exhibited significant thermal stability above about 1000° C., whereas the conventional $CoSi_2$ films exhibited significant agglomeration.

Figure 5:
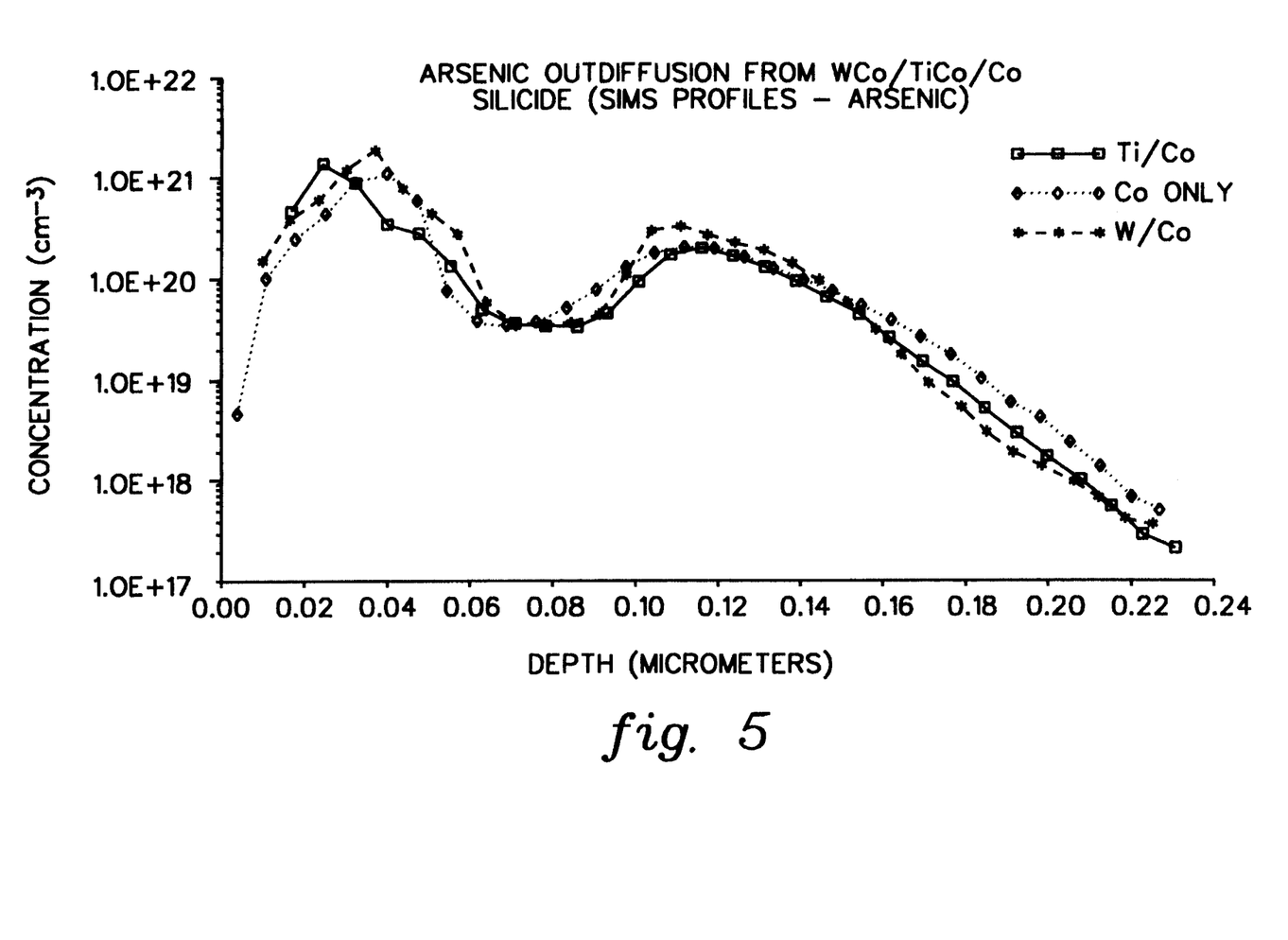
FIG. 5 is a graph of an arsenic dopant concentration versus depth SIMS profile for arsenic out-diffusion into a silicon wafer having a cobalt silicide film formed thereon according to the present invention contrasted with wafers having silicide films formed thereon using prior methods.

The out-diffusion characteristics of the epitaxial $CoSi_2$ film of the present invention were determined by implanting the films with either As or B, out-diffusing the respective dopant at various times and temperatures into an underlying silicon substrate, and then measuring the dopant and Co profiles using secondary ion mass spectroscopy (SIMS). Prior to the dopant implants, the silicide films were covered with a 30 nm $Si_3N_4$ layer to act as an additional spacer for dopant implantation, a capping film to prevent dopant evaporation during out-diffusion drive, and an etch stop for subsequent contact etching. Arsenic was first implanted. FIG. 5 is an arsenic dopant concentration versus depth SIMS profile for arsenic out-diffusion into a silicon wafer having a cobalt silicide film formed thereon according to the present invention with a 1.0 nm W underlayer contrasted with wafers having silicide films formed thereon using prior methods (conventional $CoSi_2$ and $CoSi_2$ formed using a 1.0 nm Ti underlayer). The arsenic was implanted with a dose of 1E16 atoms/$cm^2$ at an energy level of 60 KeV and was driven in with a 240 second, 900° C. RTA anneal. Along the depth axis, the surface of the silicon substrate begins at the peak near a depth of about 0.11 micrometers. It can be seen that all three silicide films have substantially similar performance in terms of As interface concentration and dopant profile.

Figure 6:
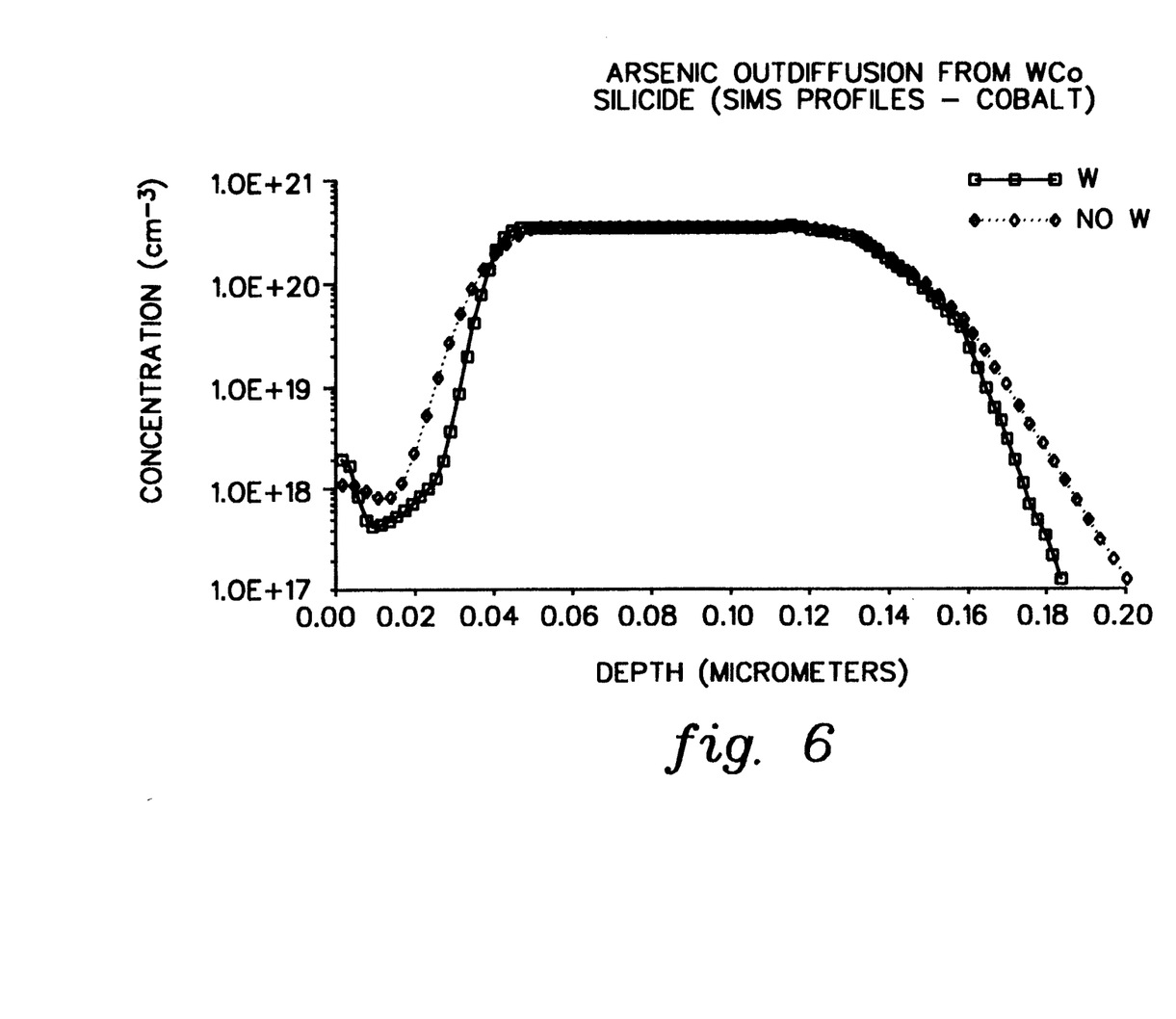
FIG. 6 is a graph of a cobalt concentration versus wafer depth SIMS profile for arsenic out-diffusion into a silicon wafer having a silicide film formed thereon by the present invention contrasted with a wafer having a conventional silicide film.

FIG. 6 is a graph of a cobalt concentration versus wafer depth SIMS profile for arsenic out-diffusion into a silicon wafer having an epitaxial $CoSi_2$ film formed thereon by the present invention contrasted with a wafer having a conventional polycrystalline $CoSi_2$ film. The process conditions were the same as for the wafers of FIG. 5. The more abrupt fall-off in Co concentration at depths greater than about 0.15 micrometers indicates a more abrupt interface for the epitaxial $CoSi_2$ film.

Figure 7:
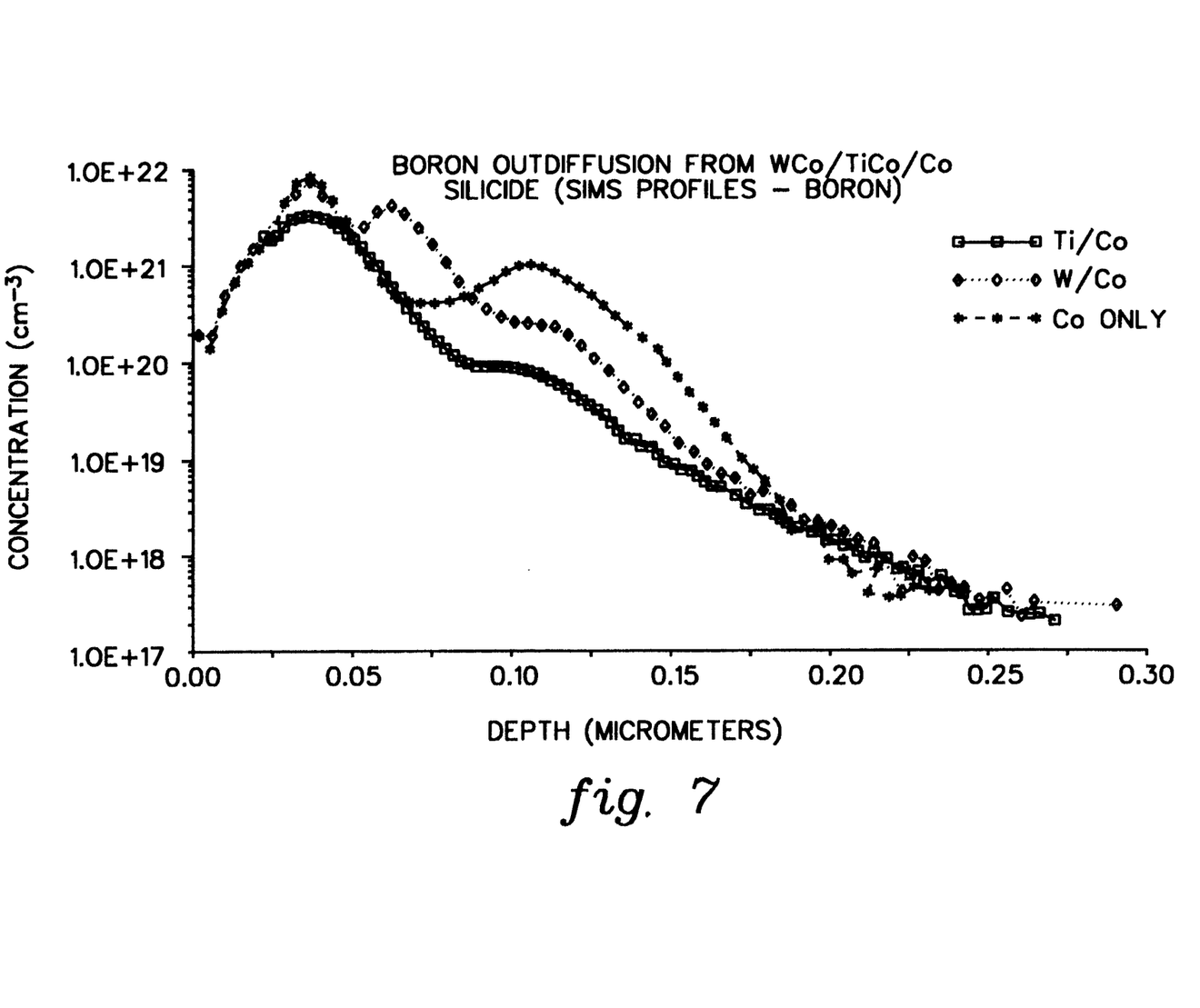
FIG. 7 is a graph of a boron dopant concentration versus depth SIMS profile for boron out-diffusion into a silicon wafer having a cobalt silicide film formed thereon according to the present invention contrasted with wafers having silicide films formed thereon using prior methods.
Figure 8:
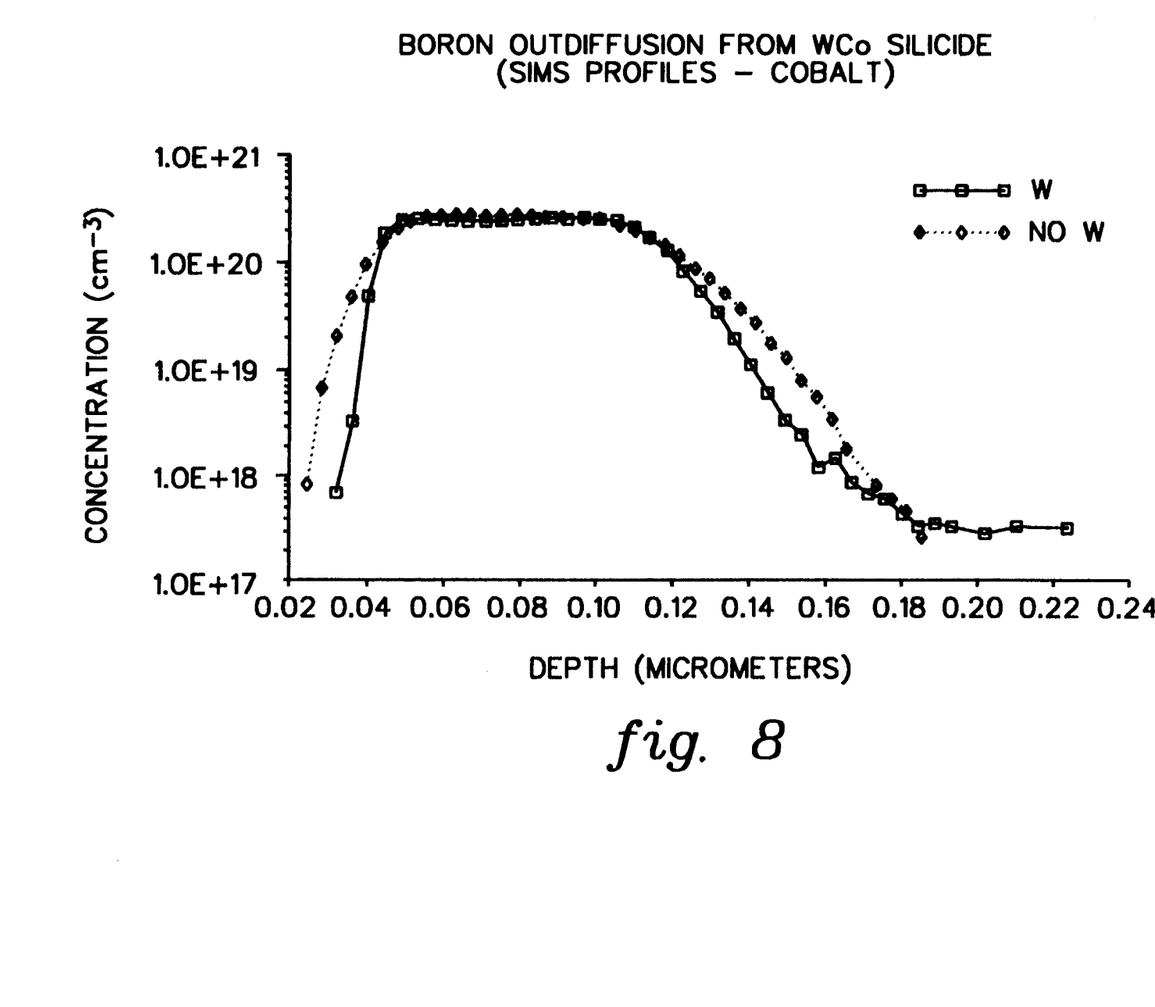
FIG. 8 is a graph of a cobalt concentration versus wafer depth SIMS profile for boron out-diffusion into a silicon wafer having a silicide film formed thereon by the present invention contrasted with a wafer having a conventional silicide film.

With reference to FIGS. 7 and 8 boron was next implanted into wafers formed under the same conditions as those for FIGS. 5 and 6, except that B was implanted at a dose of 1E16 atoms/$cm^2$ and an energy of 20 KeV and driven in with a 60 second, 900° C. forming gas RTA anneal. FIG. 7 is a graph of a boron dopant concentration versus depth SIMS profile for boron out-diffusion into a silicon wafer having a cobalt silicide film formed thereon according to the present invention contrasted with wafers having either a conventional $CoSi_2$ film or a $CoSi_2$ film formed with a Ti underlayer. It is seen that the B interface concentration (the silicide-silicon interface is at a depth of about 0.11 micrometers) is significantly higher for the $CoSi_2$ film formed using W compared to the film formed using Ti. As discussed above, Ti atoms form stable compounds with B which retard its out-diffusion. Increased B implant concentrations were also examined and found not to appreciably increase the maximum interface concentration when using $CoSi_2$ formed with a Ti underlayer.

FIG. 8 is a graph of a cobalt concentration versus wafer depth SIMS profile for boron out-diffusion into a silicon wafer having a silicide film formed thereon by the present invention contrasted with a wafer having a conventional silicide film. The $CoSi_2$ films formed with a W underlayer once again exhibit a more abrupt interface (seen at a depth of about 0.13 to 0.16 micrometers) due to their epitaxial nature.

Although the present invention has been described in detail above, it is not intended to be limited to the specific form set forth herein, but, on the contrary, it is intended to cover such alternatives and equivalents as can reasonably be included within the spirit and scope of the invention as defined by the appended claims.

We claim:

1. A process for forming an epitaxial cobalt silicide film in a semiconductor device, comprising the steps of:

forming a refractory metal layer comprising tungsten, chromium, molybdenum, a mixture thereof, or a silicide of tungsten, chromium, or molybdenum, said refractory metal layer formed overlying a silicon substrate;

forming a cobalt layer overlying said refractory metal layer; and annealing said cobalt layer at a temperature sufficiently high to form said epitaxial cobalt silicide film overlying said silicon substrate.

2. The process of claim 1 wherein said step of annealing also forms a cobalt-silicon-refractory metal alloy overlying said epitaxial cobalt silicide film.

3. The process of claim 1 wherein said step of forming a refractory metal layer and said step of forming a cobalt layer are performed consecutively in situ without removal from a vacuum environment.

4. The process of claim 1 wherein said refractory metal layer is tungsten.

5. The process of claim 1 wherein said refractory metal layer consists essentially of tungsten, chromium, or molybdenum.

6. The process of claim 1 wherein said refractory metal layer is tungsten silicide.

7. The process of claim 1 wherein said refractory metal layer is sputtered or evaporated onto said silicon substrate.

8. The process of claim 1 wherein said cobalt layer is sputtered or evaporated onto said refractory metal layer.

9. The process of claim 1 wherein said step of annealing is performed using rapid thermal annealing.

10. The process of claim 1 wherein said formed refractory metal layer has a thickness of about 0.5 to 2.5 nm.

11. The process of claim 1 wherein said formed cobalt layer has a thickness of about 5 to 20 nm.

12. The process of claim 1 wherein said step of annealing is performed at a temperature of at least about 550° C.

13. The process of claim 12 wherein said step of annealing is performed at a temperature between about 750° and 900° C.

14. The process of claim 13 wherein said step of annealing is performed for at least about 20 seconds.

15. The process of claim 1 wherein said epitaxial cobalt silicide film has a resistivity of about 15 microohm-cm.

16. A method for forming a shallow P-N junction by dopant out-diffusion from an epitaxial cobalt silicide film formed on a silicon substrate, comprising the steps of:

implanting a dopant into said epitaxial cobalt silicide film; and out-diffusing said dopant from said epitaxial cobalt silicide film into said silicon substrate by annealing at a drive temperature sufficiently high to form said P-N junction.

17. The method of claim 16 wherein said dopant is implanted so that substantially none of said dopant is implanted into said silicon substrate.

18. The method of claim 16 wherein said dopant comprises boron, gallium, phosphorous, antimony, or arsenic.

19. The method of claim 16 wherein said epitaxial cobalt silicide film is formed according to the process of claim 1.

20. The method of claim 16 wherein said drive temperature is at least about 800° C.

21. The method of claim 20 wherein said step of out-diffusing is performed for at least about 15 seconds.

22. A process for forming an epitaxial cobalt silicide film in a semiconductor device, comprising the steps of:

forming a tungsten metal layer on a silicon substrate;

forming a cobalt layer on said tungsten metal layer; and annealing said cobalt and tungsten layers at a temperature greater than about 550° C. for a time period sufficient to form said epitaxial cobalt silicide film on said silicon substrate.

23. The process of claim 22 wherein said annealing temperature is between about 750° and 900° C.

24. The process of claim 23 wherein said step of annealing is performed for a time period greater than about 20 seconds.

25. The process of claim 22 wherein said step of forming a tungsten metal layer and said step of forming a cobalt layer are performed consecutively in situ without removal from a vacuum environment.

26. The process of claim 23 wherein said tungsten metal layer has a thickness of about 0.5 to 2.5 nm.

27. The process of claim 26 wherein said cobalt layer has a thickness of about 5 to 20 nm.

28. The process of claim 23 wherein said step of annealing further forms a cobalt-silicon-tungsten alloy overlying said epitaxial cobalt silicide film.

29. A method for forming a shallow P-N junction by dopant out-diffusion from an epitaxial cobalt silicide film, comprising the steps of:

forming a tungsten metal layer on a silicon substrate;

forming a cobalt layer on said tungsten metal layer;

annealing said cobalt and tungsten layers at a temperature greater than about 550° C. for a time period sufficient to form said epitaxial cobalt silicide film on said silicon substrate;

implanting a dopant into said epitaxial cobalt silicide film; and out-diffusing said dopant from said epitaxial cobalt silicide film into said silicon substrate by annealing at a drive temperature sufficiently high to form said P-N junction.

30. The method of claim 29 wherein said annealing temperature is between about 750° and 900° C.

31. The method of claim 30 wherein said step of annealing is performed for a time period greater than about 20 seconds.

32. The method of claim 29 wherein said dopant is implanted so that substantially none of said dopant is implanted into said silicon substrate.

33. The method of claim 30 wherein said drive temperature is at least about 800° C.

34. The method of claim 29 wherein said step of out-diffusing is performed for at least about 15 seconds.

* * * * *

UNITED STATES PATENT AND TRADEMARK OFFICE
CERTIFICATE OF CORRECTION

PATENT NO. : 5,356,837
DATED : October 18, 1994
INVENTOR(S) : Geiss, et al.

It is certified that error appears in the above-indentified patent and that said Letters Patent is hereby corrected as shown below: Column 5, line 2, between "the" and "it" insert --surface of silicon substrate 10, and a cobalt-silicon-tungsten alloy layer 18 is disposed on the surface of silicide film 16. The final formed epitaxial cobalt silicide film 16 has a thickness of, for example, about 40 nm. Alloy layer 18 has a thickness that is substantially the same as the original thickness of tungsten metal layer 12, for example about 0.5 to 2.5 nm. In addition, note that epitaxial cobalt silicide film 16 is of the form $CoSi_2$. Other forms of cobalt silicide are unable to form an epitaxial layer.

Several properties of the final epitaxial cobalt silicide film compare favorably with those of conventional polycrystalline $CoSi_2$ films. For example, a conventional $CoSi_2$ film was formed on a wafer using a 18 nm sputtered layer of Co and by annealing at 750°C for 30 seconds in a forming gas of about 5-10 percent hydrogen in nitrogen. The mean sheet resistance of the film was about 3 ohms per square. In comparison, an epitaxial $CoSi_2$ film was formed by the present invention using a 1.0 nm sputtered W layer underneath an 18 nm sputtered Co layer. Annealing was then performed at 850°C for 30 seconds. The mean sheet resistance of this silicide film was about 2.7 ohms per square. This sheet resistance indicates that substantially all of the Co is converted to $CoSi_2$ according to the method of the present invention. Thus, the silicide film by the present invention has a sheet resistance substantially the same as that for a conventional silicide film.

UNITED STATES PATENT AND TRADEMARK OFFICE
CERTIFICATE OF CORRECTION

PATENT NO. : 5,356,837 Page 2 of 2
DATED : October 18, 1994
INVENTOR(S) : Geiss, et al.

It is certified that error appears in the above-indentified patent and that said Letters Patent is hereby corrected as shown below:

With respect to the reaction mechanism involved,—

Signed and Sealed this

Second Day of May, 1995

Attest:

BRUCE LEHMAN

Attesting Officer     Commissioner of Patents and Trademarks